United States Patent [19]

Gural

[11] Patent Number: 4,935,636
[45] Date of Patent: Jun. 19, 1990

[54] HIGHLY SENSITIVE IMAGE SENSOR PROVIDING CONTINUOUS MAGNIFICATION OF THE DETECTED IMAGE AND METHOD OF USING

[76] Inventor: Kenneth Gural, 7207 Dartmouth Ave., College Park, Md. 20740

[21] Appl. No.: 200,561

[22] Filed: May 31, 1988

[51] Int. Cl.$^5$ ............................................. H01J 40/14
[52] U.S. Cl. .............................. 250/578.1; 250/208.1
[58] Field of Search ............... 250/578, 551, 208, 209, 250/214 R; 307/311; 358/213.11, 213.27, 213.28; 352/30 H

[56] References Cited

U.S. PATENT DOCUMENTS

| | | | |
|---|---|---|---|
| 2,506,384 | 5/1950 | Rich | 250/214 |
| 3,138,763 | 6/1964 | Hendrickson | 328/150 |
| 3,214,592 | 10/1965 | Wilnotte et al. | 250/209 |
| 3,259,750 | 7/1966 | Volkmann | 250/211 R |
| 3,264,569 | 8/1966 | Lefferts | 330/9 |
| 3,264,572 | 8/1966 | Lefferts | 330/291 |
| 3,327,140 | 6/1967 | Rockey | 307/352 |
| 3,463,939 | 8/1969 | Sturman | 307/355 |
| 3,465,260 | 9/1969 | Sullivan | 330/277 |
| 3,467,912 | 9/1969 | Julie | 330/104 |
| 3,484,692 | 12/1969 | Lode | 324/123 R |
| 3,582,690 | 6/1971 | Yerman | 307/308 |
| 3,619,665 | 11/1971 | Kosonocky | 306/279 |
| 3,624,419 | 11/1971 | Kosonocky | 307/279 |
| 3,668,538 | 6/1972 | Hearn | 330/9 |
| 3,686,645 | 8/1972 | Bzojdo | 340/173 |
| 3,714,523 | 1/1973 | Bate | 316/235 |
| 3,753,247 | 8/1973 | Rajchman | 340/173 |
| 3,757,143 | 9/1973 | Müller | 307/291 |
| 3,770,968 | 11/1973 | Hession et al. | 250/214 |
| 3,806,729 | 4/1974 | Caywood | 250/339 |
| 3,886,468 | 5/1975 | Kruggel | 330/30 D |
| 3,944,859 | 3/1976 | Hoover | 307/308 |
| 3,946,151 | 3/1976 | Kamiyama et al. | 178/7.1 |
| 3,982,196 | 9/1976 | Poujois | 330/9 |
| 4,003,034 | 1/1977 | Au | 340/173 |
| 4,114,055 | 9/1978 | Hollingsworth | 307/362 |
| 4,239,994 | 12/1980 | Stewart | 307/359 |
| 4,376,987 | 3/1983 | Hsia | 365/184 |
| 4,409,483 | 10/1983 | Turley | 250/332 |
| 4,434,381 | 2/1984 | Stewart | 307/530 |
| 4,441,125 | 4/1984 | Parkinson | 358/213 |
| 4,634,901 | 1/1987 | McElroy | 307/530 |
| 4,678,916 | 7/1987 | Thomson | 250/370 |

FOREIGN PATENT DOCUMENTS 818118  8/1959  United Kingdom ................ 307/311

OTHER PUBLICATIONS

R. Speer: Elect. Des., V25 12/5/68, 29–30.
Chamberlain et al.: IBM TDB, V18 #3, 8/75, 948–9.
R. Broom et al.: IBM TDB, V14 #2, 7/71, 650.
V. Kumar et al.: IBM TDB, V17 #11, 4/75, 3342–3.
R. Hanna: IBM TDB V15 #11, 4/73, 3506–7.

*Primary Examiner*—David C. Nelms

[57] ABSTRACT

An image sensor having image sensing cells of extreme sensitivity, wherein, in a preferred embodiment, each cell has at least one pair of cross-coupled current control elements that provide regenerative feedback so that microscopic image influences will be continuously magnified until they become sufficiently large for sensing. The continuous magnification is allowed to take place only at a controlled rate and during a controlled time, thereby causing a controlled degree of magnification of the image signal to be developed within each cell.

33 Claims, 7 Drawing Sheets

PRIOR ART (US 3,624,419)

HIGHLY SENSITIVE IMAGE SENSOR PROVIDING CONTINUOUS MAGNIFICATION OF THE DETECTED IMAGE AND METHOD OF USING

BACKGROUND OF THE INVENTION

The present invention relates to sensing of an external influence with high precision and sensitivity that makes use of continuous magnification within each sensing cell to significantly magnify an electrical off-balance resulting from exposure to an external influence.

There are many areas of technology that require sensors to perform a measurement of the magnitude of an external influence. The influence may be electromagnetic, such as gamma rays, X-rays, ultraviolet, infrared, visual light, or radio frequency waves; the influence may be electrostatic or magnetic. The influence may be vibrational, such as ultrasound; or thermal; or resulting from beamed particles. The influence may take other forms less-well developed in current technology, such as force-derived influences (e.g., pressure or stress variations, tactile images, etc.), and chemical variations (e.g., olfactory and gustatory). In the remainder of this specification and in the claims, the term "image" will be used to refer to any form of external influence, without restriction to merely optical influences.

In image sensing arrays designed for each of the above applications, a common element is the electronic structure of the array and the sensing cells. The array may employ an orthogonal grid of conductive lines to address and sense individual sensing cells, wherein an amount of electrical charge has been developed as a result of exposure to the image. The sensing cells have means to develop a charge in response to the external influence.

For economic reasons, it is desirable to make each sensing cell as small as possible, and often to include many thousands of such cells within each array. It is generally true that the smaller each cell becomes, the less an amount of charge that may be developed in response to the image. On the other hand, the larger the array becomes—that is, the larger the number of cells in the array—the more difficult it becomes to detect the charge developed within a given cell due to the capacitance of the sensing lines, capacitive coupling between cells, and to noise introduced during the sensing process.

Heretofore, the majority of image sensors have been designed with image sensing cells having charge storage means to collect the charges resulting from the exposure to the image, and means to send the charges to external sensing means upon actuation of a control pulse. Because they contain no means for amplifying the charge within the cell, such image sensors are limited in the degree to which they can sense low image intensities.

Several image sensors in the prior art represent an attempt to improve the sensitivity of the array by including means within each cell to amplify the detected charge prior to placing the signal on the sensing lines of the array. The most common is to develop the charge on a capacitor which is further connected to the control lead of a current control element such as a bipolar transistor or FET. Although amplification is obtained through the amplifying action of the current control element, the degree of amplification is substantially dependent on fixed properties of the element. For example, there is a maximum amplification that can be obtained from a single transistor (or cascaded series of transistors, in case several are utilized within each cell). In addition, although the degree of amplification may be electronically controllable to some degree by controlling the other leads of the transistor, the range of available amplifications is limited.

Another drawback of conventional image sensors is due to the fact that the amount of charge modification effected by an image within each cell is generally proportional to the intensity of the image, whereas greatest sensitivity (amplification) is needed for low image intensities and lesser sensitivity for greater image intensities. Ideally, the signal leaving the cell should be logarithmically related to the image intensity, for then a greater dynamic range of image intensities will produce useful signals than in the case of a proportional relation. For example, if useful output voltages of an image cell can lie between 0.2 and 1 volt, a dynamic factor of 5 is available to a proportional sensing cell, while a dynamic range of 10,000 is available to a logarithmic sensing cell producing 0.2 volt per decade of image intensity. In the majority of prior art image sensors, both those without amplification means and those including proportional amplification means, the signal sent from each image sensing cell is proportional to the image intensity and therefore of limited dynamic range.

It is also known that the switching signals introduced into the array to perform the necessary addressing of the image cells may cause considerable noise in the detected signal. One method for reducing the effect of switching noise in the addressing of an array, which is commonly used in memory arrays, is to provide complementary sense lines to each cell, such that the signal developed within the cell will be placed in complementary fashion on the sense lines while any switching noises will occur substantially in common on the lines. By subtracting the signal on one line from its complementary line, much of the switching noise may be eliminated without diminution of the signal.

On the other hand, when employing complementary structure, there are often minor imbalances in the components manufactured for each of the complementary channels. In the case of extreme magnification, these minor differences may become magnified to cause considerable distortion of the developed signal.

SUMMARY OF THE INVENTION

Therefore, an object of the present invention is to provide an image sensor having extreme sensitivity which includes means within each sensing cell for continuously magnifying the off-balance developed by exposure to an image, wherein the resultant degree of magnification may be controlled electronically to allow values within a large range of values.

Another object of the invention is to provide an image sensor having extreme sensitivity wherein each image sensing cell is capable of producing an image signal of wide dynamic range substantially logarithmically related to the image intensity.

Another object of the invention is to provide an image sensor having a complementary structure in order to minimize effects of switching noise on the developed signal.

Another object of the invention is to provide an image sensor of extreme sensitivity wherein imbalances due to manufacturing variations between complementary portions of the array can be compensated by electronic means.

These and other objects are met in the present invention by employing an image sensor having image sensing cells of extreme sensitivity, wherein, in a preferred embodiment, each cell has at least one pair of first and second current control elements that are cross-coupled so that microscopic image influences will cause a race condition to occur between the two current control elements and continuous magnification of the image influence to occur. The race condition is allowed to take place only at a controlled rate and during a controlled time, thereby causing a controlled degree of magnification of the image influence to be developed within each cell. The cell may be compensated for imbalances due to manufacturing variations. The imbalance compensation may be accomplished mechanically; or electronically by changing the parameters of an electrically alterable element or by precharging each cell with a compensating off-balance prior to exposure to the image.

BRIEF DESCRIPTION OF THE DRAWINGS

FIG. 1b is a timing diagram showing a method of operating the circuit of FIG. 1a.

FIG. 2b is a timing diagram showing a method of operating the circuit of FIG. 2a.

FIG. 3a shows a layout suitable for constructing the circuit of FIG. 2a.

FIG. 3b is a composite of a plurality of sections taken across the layout of FIG. 3a.

FIGS. 4a and 4b show preferred sensing arrays according to the present invention which employ sensing cells of FIG. 2a.

FIG. 6b is a timing diagram showing a method of operating the circuit of FIG. 6a.

DETAILED DESCRIPTION OF THE PREFERRED EMBODIMENTS

Figure 1A:
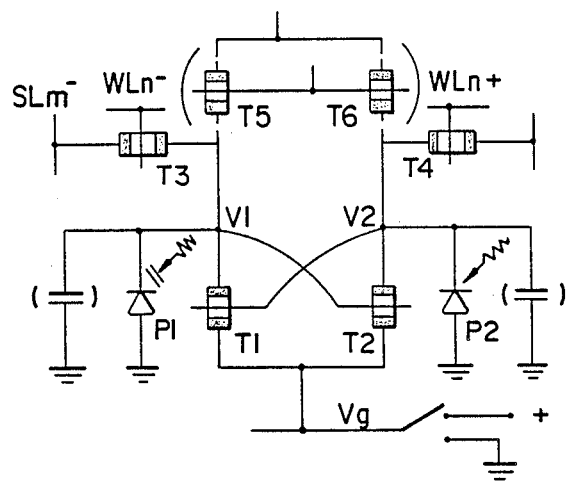
FIG. 1a shows a prior art image sensing cell of extreme sensitivity which exhibits similarities to the present invention.

FIG. 1a shows a prior art image sensing cell of extreme sensitivity that may be employed to produce a binary representation of an image. The circuit features cross-coupled n-MOSFETs T1 and T2 having common source connection to a control lead Vg. Two photodiodes P1 and P2 are connected to the drains of T1 and T2 respectively. Each photodiode has an inherent capacitance that is shown by the capacitors in parentheses. The drains of T1 and T2 are further connected to sense lines SLm− and SLm+ through switching transistors T3 and T4 under control of word lines WLn− and WLn+. An additional structure for providing positive biasing of this circuit may also be included as shown in parentheses at the top of the circuit. This circuit is described in detail in U.S. Pat. No. 3,624,419 to W. Kosonocky using p-MOSFETs instead of the n-MOSFETs shown here.

Figure 1B:
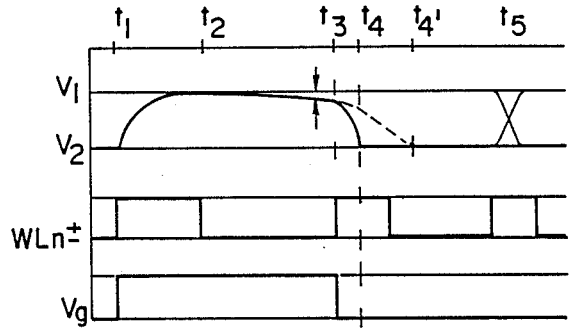

In operation as shown in FIG. 1b, both photodiodes are precharged to positive potential at time t1 by asserting word lines WLn− and WLn+ while placing a positive potential on the sense lines, as shown by the signals V1 and V2. In addition, Vg is raised to positive potential. During the time between t2 and t3, after the word lines have been turned off, photons will arrive at the two photodiodes P1 and P2, thereby somewhat discharging them. The voltage corresponding to whichever diode receives the greater illumination (say V2) will drop faster than the other voltage (V1), although the amount of drop may be quite small. After a period of exposure, Vg is lowered to ground potential and T3 and T4 are turned on by action of WLn− and WLn+. These transistors T3 and T4 are small enough to act as load devices. A race condition then exists between T1 and T2, and since V2 is slightly lower it will continue to drop while V1 rises. At a later period of time, the state of T1 and T2 may be sensed by again asserting the word lines and sensing the current moving into the sense lines at a point remote to the illustrated cell.

The circuit of FIG. 1a provides extreme sensitivity to external illumination. In fact, the degree of magnification within the cell can be considered to be infinite because the resulting signal dependents only on the sign of the detected charge difference, rather than on its magnitude. Any charge off-balance, even the weakest off-balance, will cause a large and discrete output. In the case where one of the photodiodes is shielded from the illumination, the circuit of FIG. 1a provides an extremely sensitive detector of the presence or absence of illumination, but cannot give any indication of its magnitude since, no matter what initial image is present, the photodiodes always end up completely charged or discharged.

The present invention is concerned with the situation where the *magnitude* and not just the *sign or presence* of the image is desired to be measured. In order to use means and method similar to FIG. 1a for the purpose of measuring magnitude, it is necessary to control the continuous magnification so that only controlled growth occurs during the period of time after t3, in other words it is necessary to slow down the rate of growth as shown by the dashed lines through time t4'.

Figure 2A:
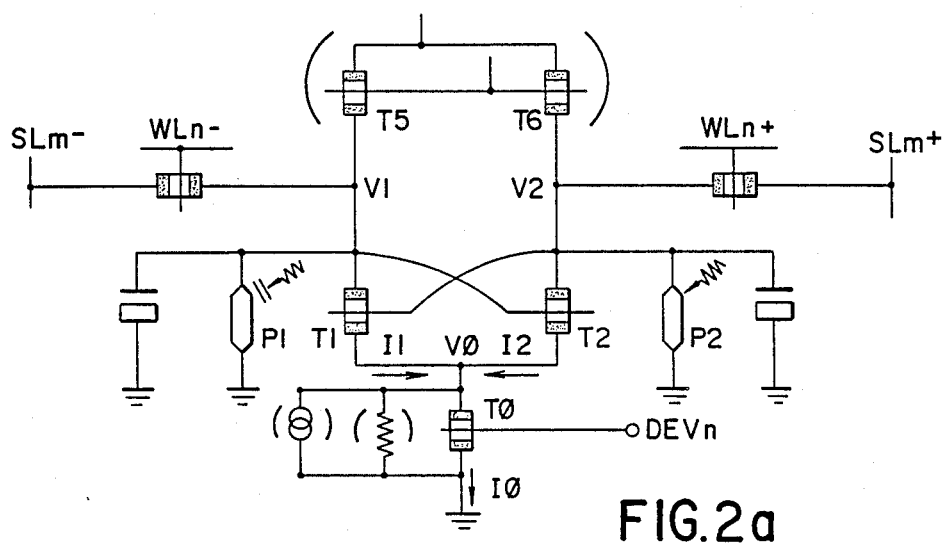
FIG. 2a shows preferred embodiments of the present invention.

One preferred embodiment for accomplishing the controlled growth is shown in FIG. 2a. This circuit is similar to the circuit of FIG. 1a except that an additional control element T0 which may be an n-MOSFET is included in series with the sources of the transistors T1 and T2. Alternatively, the additional element may comprise impedance means or constant current means as shown in parentheses. Indeed, as is well known by those skilled in the art, an FET may approximate the behavior of impedance means or constant current means when controlled by a suitable control potential. Also shown in FIG. 2a are explicit MOS capacitors C1 and C2 in shunt with the image transducers P1 and P2 to increase their capacitance, although this change is not a requisite of the present invention. Additionally, P1 and P2 are illustrated as generic shapes rather than photodiodes, because the actual element to be employed for providing image-responsive discharge of C1 and C2 will depend upon the nature of the image to be detected. For example, a tactile sensor might employ pressure-sensitive resistance means, while a thermal sensor might employ thermistor means. Additionally P1 and P2 might be two current control elements having control leads actuated by transducers responsive to the image.

Figure 2B:
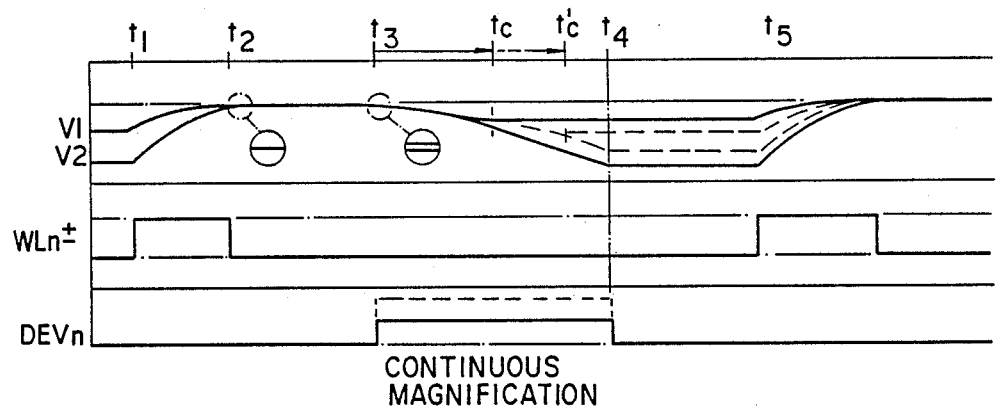

In operation as shown in FIG. 2b, the two capacitors C1 and C2 are first precharged to a potential by application of control signal to the word lines WLn− and WLn+. Meanwhile, the transistor T0 is maintained OFF by control potential DEVn. Between time t2 and t3, the cell is exposed to the image, thereby slightly discharging one of the capacitors as indicated by the magnified view of V1 and V2. After a suitable exposure period, the transistor T0 is actuated by control line DEVn to allow current I0 to pass through T0 to ground. T0 need not be driven entirely ON; in fact, the degree to which T0 is actuated provides one factor in the control of the growth rate. Furthermore, T0 can be actuated with a non-rectangular signal such as a ramp voltage in order to start with a smaller I0 and to gradually increase I0 during the period of continuous magnification. The current I0 that travels through T0 comes from the currents I1 and I2 travelling through T1 and T2, and thus I0 equals the sum of I1 and I2. Initially, these currents will divide essentially equally because the control elements of T1 and T2 have approximately the same potential, with only a slight offset due to the off-balance caused by the image. However, the off-balance will become accentuated due to the regenerative nature of the cross-coupled circuit. In other words, because one of the control elements (say the control of T1) is lower in potential than the other (that is, V2<V1), then T1 will be less conductive and I1 will be less than I2. As a result, V2 which started lower will continue to drop at a faster rate than V1. Any initial off-balance between capacitors C1 and C2 will become enhanced by the race condition between T1 and T2, and a continuous magnification will occur. Because the current through T2 is greater than the current through T1 and continues to grow, eventually a point in time is reached when the entire current I0 is consumed by T2, with none going through T1. Beyond this point in time, identified by tc in FIG. 2b, C1 ceases to discharge and retains its potential, while C2 continues to discharge at a uniform rate. After a designated time t5, T0 is shut off and further discharge of C2 (and C1) ceases. Later, the difference in potential developed during the magnification period may be sensed by activating the word lines WLn− and WLn+ to pass the potential on the capacitors to the sense lines SLm− and SLm+.

An approximate mathematical analysis may be employed to give a further idea of the operation of the circuit of FIG. 2a. Assuming that the transistors T1 and T2 exhibit transfer characteristics represented by the formula:

$$I = bt^*(V - Vt)$$

then a set of coupled equations can be written for the circuit as follows:

$$I0 = I1 + I2$$
$$I1 = bt^*(V2 - (V0 + Vt))$$
$$I2 = bt^*(V1 - (V0 + Vt))$$

-continued
$$C^* dV1/dt = -I1$$
$$C^* dV2/dt = -I2$$

where I0, I1 and I2 are the currents through transistors T0, T1 and T2; and V0, V1 and V2 are the electric potential at the drains of T0, T1 and T2.

These equations may be solved to produce:

$$C^* d(sg)/dt = I0/2$$
$$C^* d(xi)/dt = bt^* xi$$
where $sg = (V1 + V2)/2$,
and $xi = V2 - V1$ Assuming that the current I0 is substantially independent of time as is characteristic of n-Mosfets in the pinchoff region, the first equation may be integrated to yield:

$$sg = \text{initial}(sg) - I0^*t/2C$$

where t is the length of time the integration occurs. In other words, sg, the average of V1 and V2, will diminish at constant rate.

The second equation above yields:

$$\text{final}(xi) = \exp(gm^* t)^* \text{initial}(xi)$$

where
  $gm = bt/C$ and
  $xi = V2 - V1$

Thus, during the continuous magnification period, the final difference in potential between V2 and V1 will be proportional to the initial difference in potential, with proportionality factor exp(gm * t) that depends in part on the length of time allowed for the growth. The expential growth of the magnification can give rise to exceptional yet controlled magnification rates.

In the above simple analysis, the differential growth rate gm=bt/C is seen to be independent of the overall current I0 through T0. On the other hand, the common-mode depletion of capacitors C1 and C2 is directly dependent upon I0. Since it is necessary for the capacitors to retain sufficient charge for the differential growth to occur, it can be seen therefore that generally I0 will be selected to be as small as possible to enable a long differential growth period. One way to accomplish this is to choose T0 to have a width/length ratio many times smaller than T1 and T2, or to provide a control signal DEVn only slightly above T0's threshold. Also, by charging C1 and C2 to higher initial voltages, the differential growth will be unaffected but the common-mode depletion time can be extended. Of course, if the additional structure comprising T5 and T6 is employed to maintain a positive current into C1 and C2, then it is merely necessary to balance I0 against the current through T5 and T6 to maintain V1 and V2 within suitable bounds.

The approximate analysis presented above for the exponential growth of the differential potential holds so long as I1 and I2 remain greater than zero. However, during the continuous magnification, one of I1 and I2 is dimishing while the other is increasing, and eventually a point in time is reached wherein the lesser (say I1) has dimished to zero while the greater (say I2) now consumes the total current I0. In this simple mathematical model, this occurs when the difference in voltage between V2 and V1 reaches a threshold voltage xi(th)

which may be seen from the above equations by setting I1=0 and I2=I0 to be:

$$xi(th) = I0/bt$$

Once |xi| reaches this threshold, one of the transistors (say, T1) is entirely cut off and the other is entirely conducting; whereby the conducting side will continue to discharge at uniform rate without further continuous magnification. The time it takes for an initial xi to reach the threshold xi(th) may be computed as follows:

$$xi(th) = \exp(gm * tc) * \text{initial}(xi)$$

thus, $$tc = -(1/gm) * \log(\text{initial}(xi)/xi(th))$$

For a smaller initial(xi) (or for smaller growth rate gm), the time tc' for xi to grow to the value xi(th) will be longer, and the resulting xi at time t4 will be smaller, as indicated by the dotted lines in FIG. 2b.

Figure 2C:
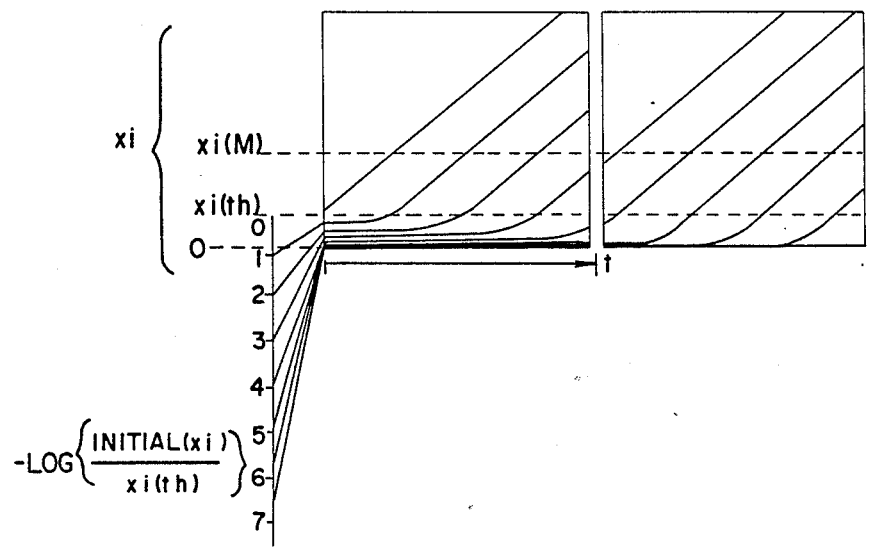
FIG. 2c a timing diagram showing the growth of the differential signal.

Curves showing the continuous magnification and subsequent linear increase upon reaching xi(th) for a variety of initial values of xi are shown in FIG. 2c. The initial values of xi are shown on the left. The final values of xi after a period of time t are shown to the right of the first block. Also shown on the left is a logarithmic scale of the initial xi. For initial xi of magnitude greater than xi(th), there is only linear increase. For initial xi less than xi(th), there is a period of exponential growth corresponding to the continuous magnification, followed by a period of linear increase, provided the initial xi is sufficiently large that the exponential growth will allow it to reach xi(th) within the time t.

One of the significant advantages of the present invention is the logarithmic relationship between final xi and initial xi. Each of the curves of FIG. 2c rising above xi(th) correspond to final values of xi in arithmetical relation as indicated by the equally spaced lines, but initial values of xi in geometric relation (i.e., whose logarithm is in arithmetical relation). This significant advantage means that weak signals will be magnified far in excess of strong signals. The resulting dynamic range of sensors according to the present invention can be quite large.

On the other hand, in the event it is desired to obtain a linear relationship between the initial and final xi rather than a logarithmic relationship, it is merely necessary to measure only those final xi staying below xi(th), for these curves represent those xi still undergoing continuous magnification, and thereby still linearly related to their initial xi.

As discussed above, generally the development current I0 will be selected to be as small as possible to enable a lengthy growth period. On the other hand, since xi(th) is dependent on I0, the current I0 cannot be chosen too small, since cells having initial |xi| lying above xi(th) do not receive continuous magnification. Thus there is a tradeoff concerning the choice of I0. Despite this tradeoff, it has been easy to obtain dynamic ranges in excess of 10,000 when using typical FETs having W/L parameters chosen, for example, wherein T0 is smaller than T1 and T2 by a factor of 100. It is also possible to vary I0 during the continuous magnification period as discussed above, such as to start with a small I0 and effect a gradual increase during the magnification period.

FIG. 2c also illustrates a technique for increasing the dynamic range of sensors of the present invention beyond their already large range. After a period of continuous charge magnification as illustrated in the first block of FIG. 2c, only those cells having xi that has reached a sufficient threshold (say, xi(M)) are sensed during a preliminary sensing step. The remaining cells are left untouched by the preliminary sensing, and are allowed to continuously magnify during a second period of time represented by the second block, whereupon the cells are sensed. Thus, even though a sensing cell may be able to output only a few decades of dynamic range during single sensing step; by performing this testing and double sensing procedure the combined dynamic range is effectively doubled. In fact, the procedure of sensing only "fully developed" xi may be repeated any number of times, limited only by the maximum degree of magnification possible as determined by imbalance considerations and thermal noise, and by the maximum amount of charge available in C1 and C2, as discussed above. This latter consideration is not a problem if the additional biasing circuitry of FIG. 2a (comprising T5 and T6) is employed to inject positive current to maintain the electrical potential on C1 and C2 to within useful ranges.

Sensing of only those cells having xi above a desired threshold (xi(M)) may be accomplished with the image sensing cell of FIG. 2a without additional structure. Since switching transistors T3 and T4 will not conduct until their gates rise above their sources by a definite amount; and since those cells having greatest xi will have lowest potential on the sources of at least on of the transistors T3 and T4; it is sufficient to accomplish the selective sensing of the cells by controlling the control potential applied to the word lines WLn− and WLn+. A preferred method for establishing the control potential is shown schematically in FIG. 5, wherein a dummy cell provides a "zero image" reference level which is buffered by amplifier 535, raised by FET 536 by one voltage threshold and diminished by xi(M) to provide the sense level for the word lines. Due to the voltage threshold of T3 of T4 which counteract the threshold provided by FET 536, those image sensing cells having V1 or V2 lying below the "zero image" reference level by more than xi(M) will have T3 or T4 actuated by the word line.

Figure 3A:
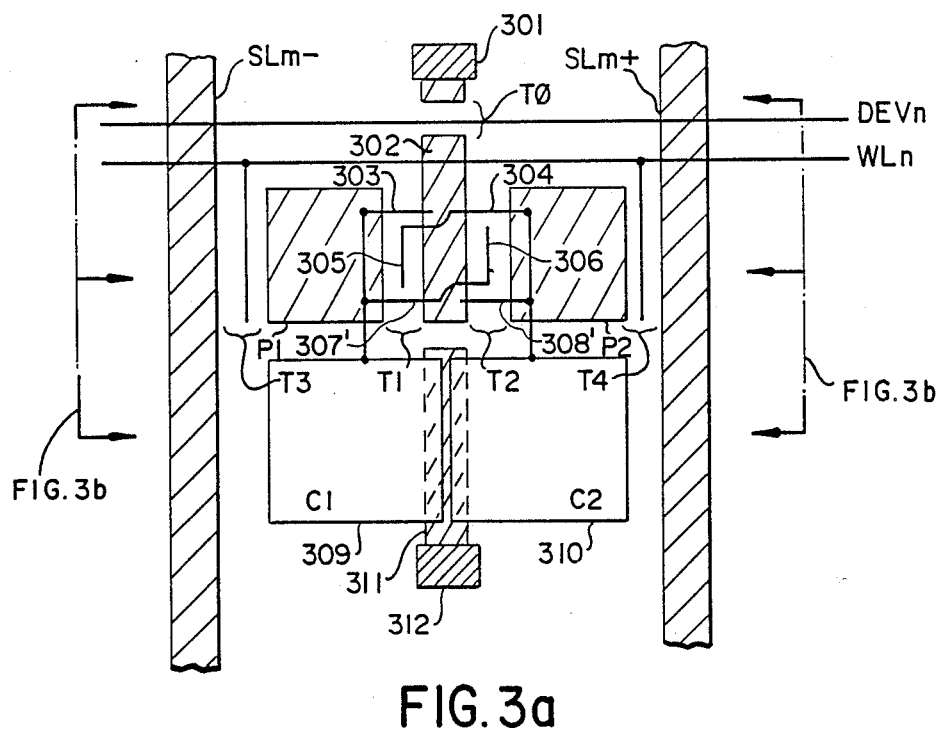
Figure 3B:
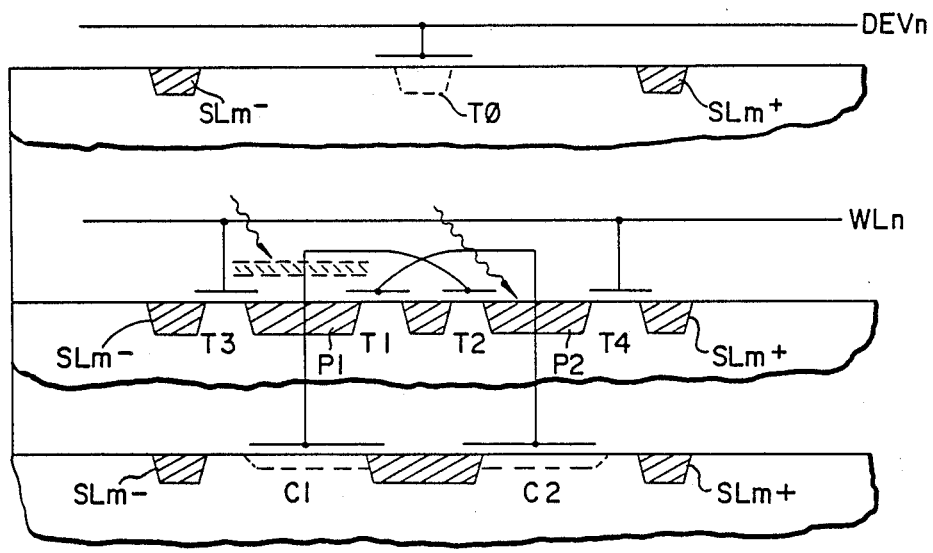

The circuit of FIG. 2a may be readily implemented as an integrated circuit by those skilled in the art. FIGS. 3a and 3b show a typical example of a layout suitable for implementing the circuit of FIG. 2a for the case where the circuit has a radiation detector and is used to sense electromagnetic radiation or particle beams. FIG. 3a shows a plan view of the layout, while FIG. 3b shows multiple sections as indicated in FIG. 3a. Shown as n-diffusions on a p-substrate are sense lines SLm− and SLm+, radiation-sensitive diodes P1 and P2, the source region 311 for MOS capacitors C1 and C2, and the common source region 302 T1 and T2, which also serves as the drain for T0. The source and drain of FET T3 are edges of SLm− and P1, respectively; similarly for FET T4. The gates of T0 - T4 and the upper electrodes of capacitors C1 and C2 are formed as metallizations over a then oxide layer. Additional metallizations over a thick oxide layer connect the gates 305, 306 of T1 and T2 with the respective diode P2, P1 (through ohmic contacts, not shown) and capacitors C2, C1; and also forms the control lines DEVn and WLn. In the layout shown, the two word lines WLn+ and WLn− of FIG. 2a have been combined into a single line WLn. Two appendices 303 and 308 of the additional metallization are included to increase the symmetry of the layout. The sources of T0 and of the capacitors C1 and C2 are grounded by an n++ punchthrough 301 and 312 to the grounded p-substrate. At least one of the radiation detectors, say P1, has an overlying shield. The optional biasing transistors T5 and T6 are not shown in this layout. Variations of this layout can readily be designed by those skilled in the art.

Figure 4A:
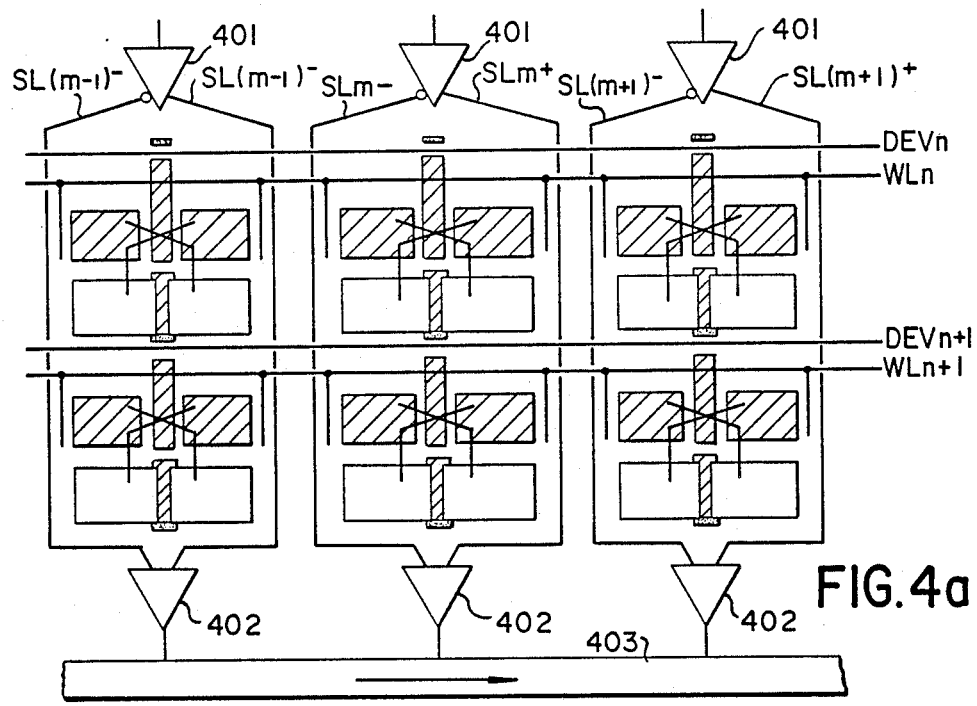
Figure 4B:
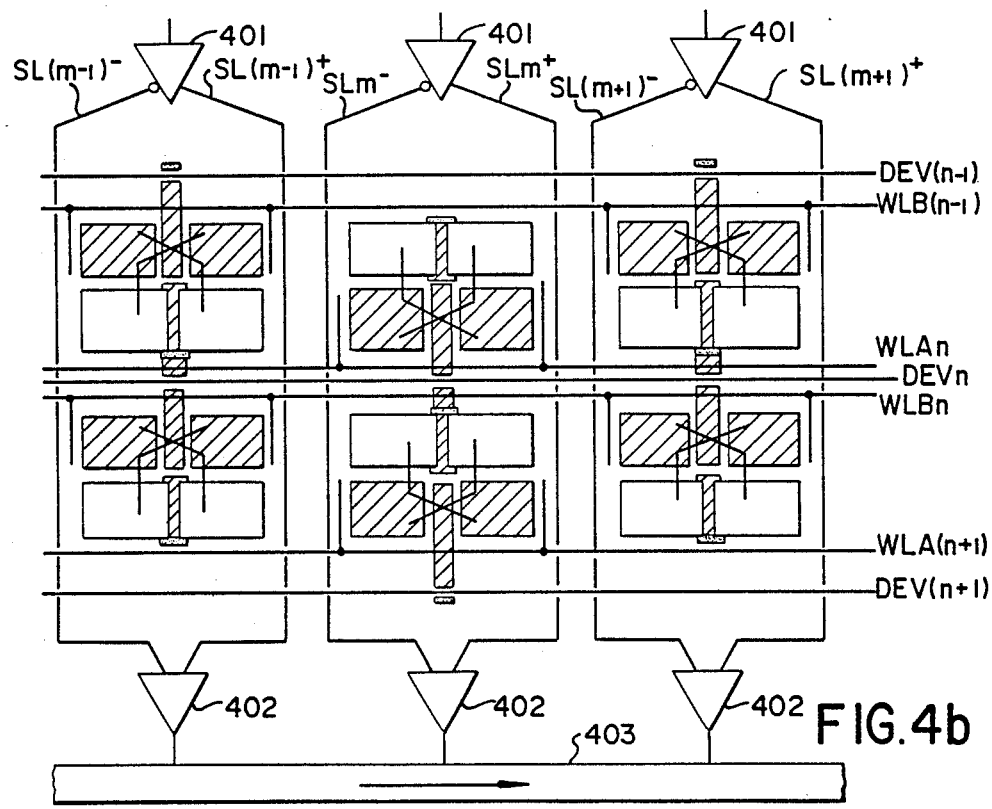

FIGS. 4a and 4b schematically show arrangements of image sensing cells such as those of FIG. 3a to form an image sensing array. In FIG. 4a the image sensing cells form a rectangular lattice, each column having a precharge circuit 401, two sense lines SLm− and SLm+, and a sense amplifier 402; and is connected to some type of multiplexing or shifting means 403. Each row has a word line WLn and magnification control line DEVn. In FIG. 4b the image sensing cells are inverted in alternate columns to increase the effective sensing resolution of the array, as is known by those skilled in the art. Each column has a precharge circuit 401, two sense lines SLm− and SLm+, and a sense amplifier 402; and is connected to some type of mulitplexing or shifting means 403. Between each row are two word lines WLAn and WLBn which actuate alternate image sensing cells, and a single control line DEVn for causing the continuous magnification. The alternate image sensing cells may be actuated during alternate fields in a double interlaced scanning mode, or alternatively, all the cells in a row may be actuated by asserting two word lines (e.g., WLAn and WLB(n−1) during the first filed and (WLAn and WLBn) during the second field).

Figure 5:
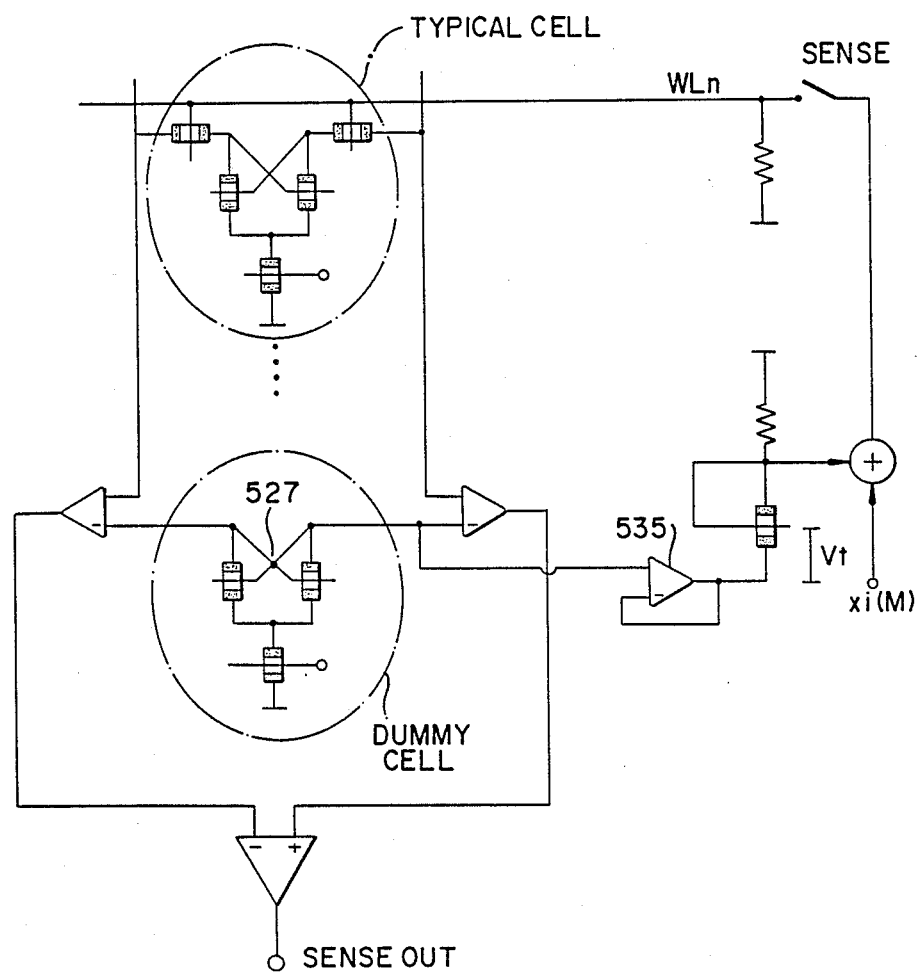
FIG. 5 shows the use of a dummy cell for determining the "zero image" operating characteristics of the circuit of FIG. 2a in conjunction with various sensing circuitry.

Not shown in FIG. 4a and 4b is an overlying filter that may be used to obtain sub-specificity to the external influence, such as a color filter matrix in the case of an optical sensor or a chemical filter matrix in the case of a chemical sensor to allow various of the sensors in the array to be sensitive to diverse spectral ranges. As is also well known by those skilled in the art, the sensed signals may be combined to improve the image quality, such as for increasing resolution or signal/noise, reducing aliasing, or eliminating defective signal values and smear.

the sense amplifier 402 employed to obtain the image signal from the sense lines may be a conventional differential amplifier or may be set of three differential amplifiers for comparing each pair of sense lines with a reference level obtained from a dummy cell prior to comparing with each other to thereby remove a common-mode signal, as shown in FIG. 5. The dummy cell has identical structure to each of the image cells with the exception that all image transducers contained therein are shielded, and the cross-coupled paths are shorted together with connection 527. The array may be formed with columns or rows having a plurality of dummy cells in case the continuous magnification is applied to the various image sensing cells in time staggered relationship, or in case it is expected the dummy cells may give different results for different positions within the array. The dummy cell may also be used to determine the optimal control potential to apply to the line DEVn.

Each of the sense amplifiers shown in FIG. may have a conventional differential structure, or may themselves have means for amplification through continuous magnification in a manner similar to the image sensing cells. In such case, the sense amplifier has a cross-coupled pair of current control elements and is operated by first balancing the amplifier; then causing an off-balance condition by exposure to the lines to be sensed and effecting a limited amount of continuous magnification. Aside from replacing the image responsive means with off-balance means responsive to the lines to be sensed, the operation is identical to the image sensing cells and further discussion is considered unnecessary.

SECOND PREFERRED EMBODIMENT

Figure 6A:
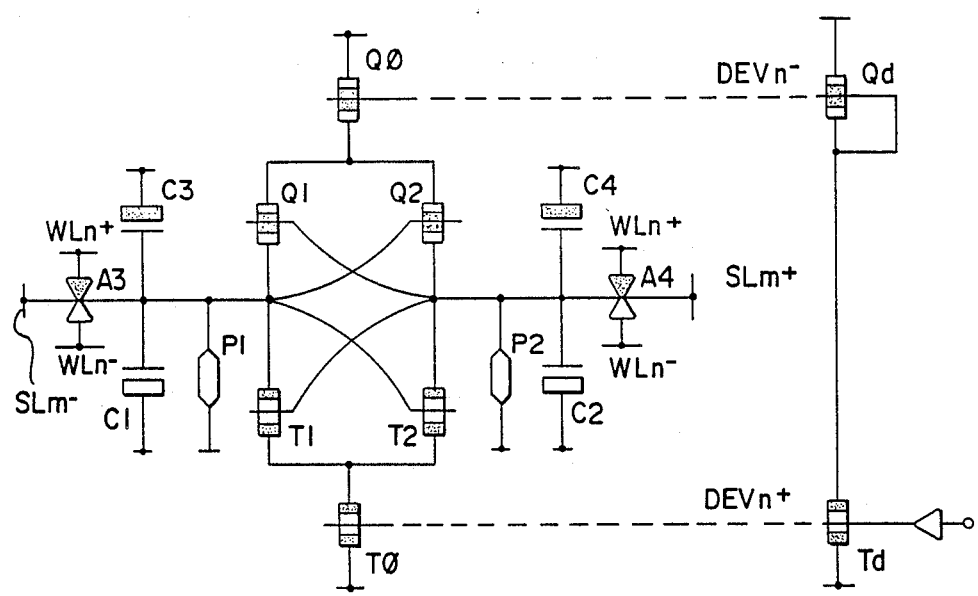
FIG. 6a shows a second preferred embodiment of the present invention using elements having complementary symmetry.

A second preferred embodiment of the present invention utilizing a CMOS arrangement for performing the continuous magnification is shown in FIG. 6a. In this embodiment, the positive current injecting arrangement comprising T5 and T6 of FIG. 2a has been replaced with a complementary circuit comprising Q0, Q1 and Q2 of opposite conductivity type to T0−T2 (i.e., in this discussion, p-MOSFETs). The transistors may be chosen to have all electrical characteristics the same as their respectively numbered n-MOSFETs (but of opposite polarity). Also shown connected to the sensing cell is a current driving circuit comprising complementary transistors Td and Qd in current mirror arrangement, to provide controls DEVn and DEVn− to produce balanced currents through T0 and Q0. The current balancing for T0 and Q0 may also be obtained from measurements of a dummy circuit (not shown). The transistors T3 and T4 have been replaced with analog gates A3 and A4 (an n-MOSFET and a p-MOSFET in parallel) which are driven by complementary word lines. The use of analog gates rather than transistors of single conductivity type gives improved operating properties to the circuit, although the single transistor arrangement will also work. In addition, a single transistor arrangement with T3 and T4 of opposite conductivity type will also work, since in most cases it will be known in advance which of V1 and V3 will rise and which will fall.

Figure 6B:
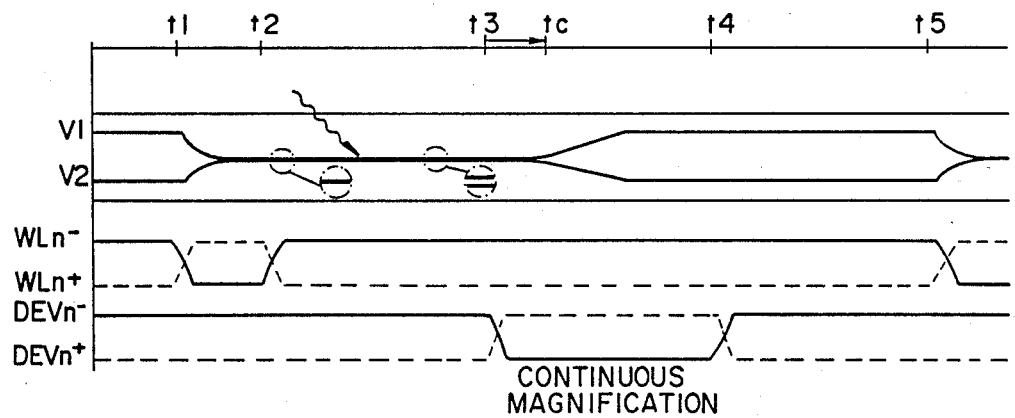

In operation of the circuit of FIG. 6a, the capacitors C1 and C2 are charged through the analog gates to a suitable voltage such as midway between ground and the positive supply. Meanwhile, T0 and Q0 are maintained Off. The cell is exposed to an image to create an off-balance in the circuit, such as by P1 and P2. T0 and Q0 are then turned ON to allow continuous magnification during a finite period of time, as shown in FIG. 6b. Finally, T0 and Q0 are turned OFF, thereby maintaining the magnified signal on C1 and C2. The signal may later be sensed through the analog gates. As with the previous embodiment, the signal may also be submitted to further magnification at a later time such as after a testing step by turning ON transistors T0 and Q0 again.

The embodiment of FIG. 6a, although having more components per cell than the embodiment to FIG. 2a, has the advantage that the common-mode currents are balanced, and thus the continuous magnification period of the differential signal can be exceedingly long, thereby providing the potential for extreme magnifications of the detected image.

Circuit layouts for implementing the CMOS circuit of FIG. 6a on a semiconductor substrate similar to FIG. 3 are not shown in this specification, as they may be readily carried out by those skilled in the art. The CMOS extrapolation of the array layouts of FIG. 4 and the sensing circuits and dummy cell of FIG. 5 also follow in a staightforward manner and are considered within the abilities of those skilled in the art.

VARIATIONS OF THE PREFERRED EMBODIMENTS

Numerous variations of the embodiments of FIGS. 2a and 6a are possible which will provide a period of continuous magnification suitable for the present invention. For example, the current control elements may be bipolar transistors or other current control elements, and may themselves be image-sensitive. Other variations are shown generically in FIGS. 7a and 7b, wherein along with the basic circuits of FIGS. 2a and 6a have been added miscellaneous additional elements, any of which may be an image transducing element, a current control element, a passive device, or no element. Concerning the placement of the image transducing elements, it should be appreciated that any arrangement will be satisfactory so long as the circuit will be driven to off-balance by exposure to an image. Concerning additional passive elements or other current control elements, it should be appreciated that any arrangement will be satisfactory so long as the circuit will be at an electrical unstable equilibrium during the continuous magnification step.

Figure 7A:
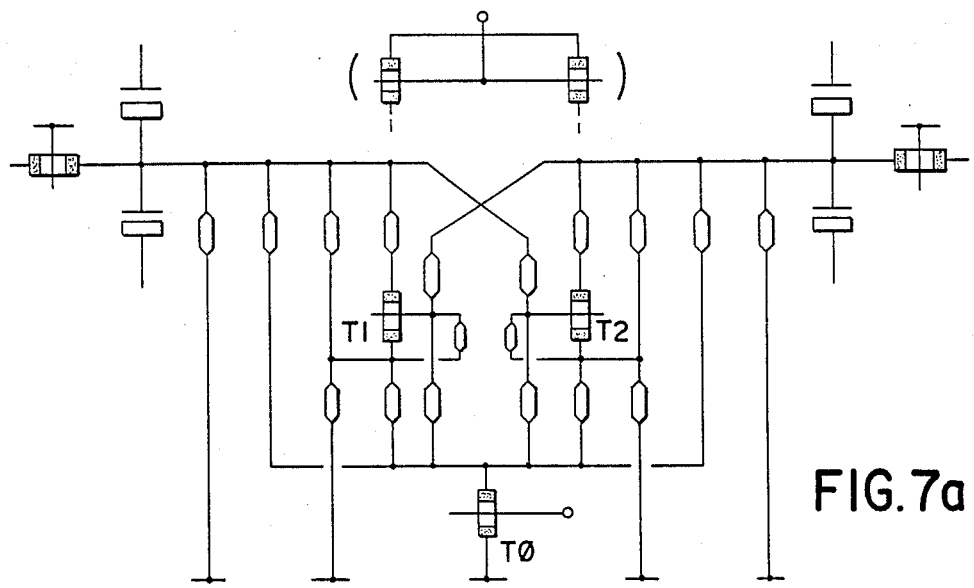
FIGS. 7a and 7b show miscellaneous variations of the circuits of FIGS. 2a and 6a which will also work with the present invention.
Figure 7B:
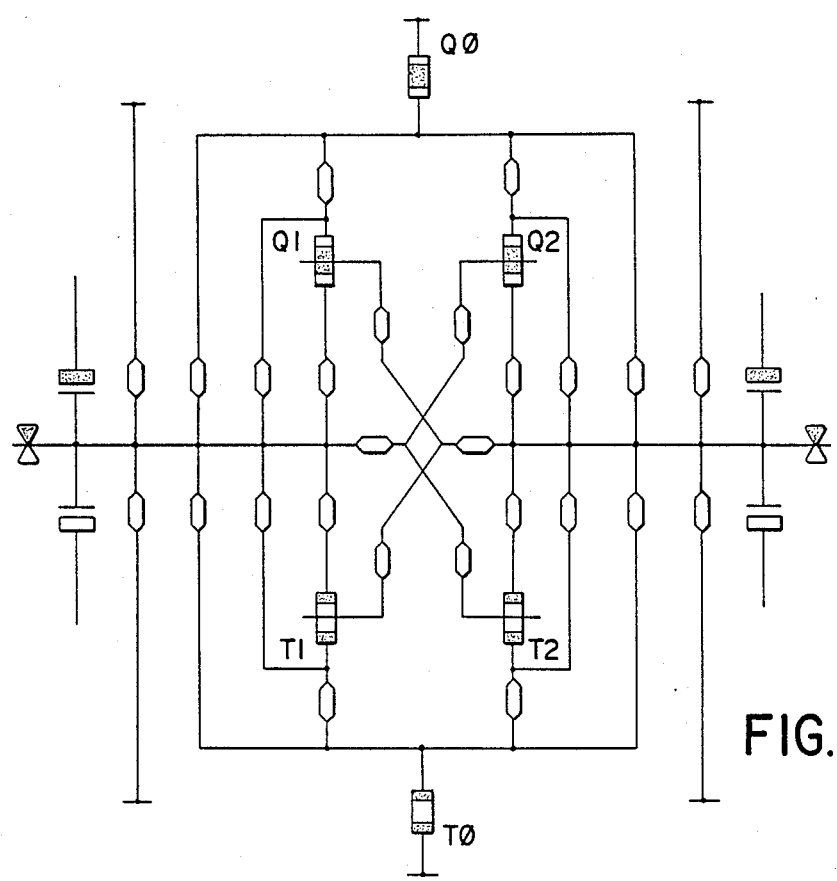
Figure 7C:
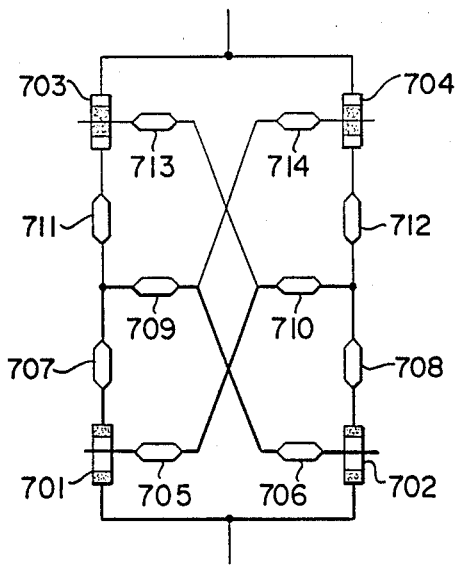
FIGS. 7c and 7d show a variation of the circuit of FIG. 6a for the purpose of illustrating the concept of an electrical sub-network.
Figure 7D:
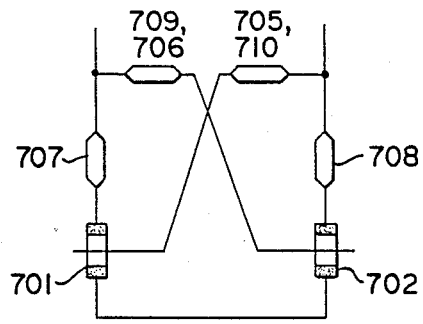

Each of the variations shown in FIGS. 7a and 7b have in common that they contain at least one sub-network having cross coupled current control elements. For example, FIG. 7c shows one such variation that may be derived from FIG. 7b, including a sub-network outlined in heavy lines that comprises two cross-coupled current control elements 701 and 702. The sub-network is shown more clearly in FIG. 7d, wherein the series elements (705, 710) and (709, 706) of FIG. 7c may be viewed as single elements by well-known combining rules of conductive elements. The circuit of FIG. 7c also includes a second such sub-network, comprising current control elements 703, 704 of opposite conductivity to 701, 702 and additional elements 713, 714, 711, 712, 709, 710. This second sub-network thus has two elements in common with the first sub-network. It should be appreciated that the expression "contains two sub-networks" is to be understood in the mathematical set theoretic sense wherein a set of elements may contain two subsets which however may have elements in common. In addition, two networks are considered equivalent if one may be transformed into the other using the simple rules of combining elements in series and in parallel.

In a more general sense, each of the variations illustrated has in common the property that at least one circular path exists through the network, which becomes unstable when current is allowed to flow through the system. For example, in the sub-network shown in FIG. 7d, a circular path which becomes unstable may be traced through the elements 709, 706, 702, 708, 710, 705, 701, 707. As is well known from the mathematical analysis of electrical networks, an unstable circular path has the property that the open loop transfer function of the circular path equals unity for values of the Laplace variable lying in the positive half of the complex plane. In addition, the growth rate of the instability is given by the real values of the Laplace variable lying in the positive half plane.

IMBALANCE COMPENSATION

The extreme sensitivity of image sensors constructed and used according to the preferred embodiment requires carefully balanced electrical channels for performing the race condition resulting in the continuous magnification. Any manufacturing imbalances in the channels will limit the sensitivity of the image sensor; the maximum image intensities that may be sensed are roughly the order of magnitude of the manufacturing imbalances. This is true even if post-processing of the image signal removes some of the imbalance error, because the wide dynamic range available to logarithmic magnification is swamped by manufacturing imbalances.

Imbalances can arise from a number of manufacturing tolerances. Consider, for example, the effect of transistors T1 and T2 having different threshold voltages Vt1 and Vt2, respectively. From the equations:

$$I1 = bt*(V2-(V0+Vt1))$$

$$I2 = bt*(V1-(V0+Vt2))$$

and the remainder of the equations above, can be obtained the result:

$$C*d(xi)/dt = bt*(xi+dxi)$$

where $dxi = Vt2 - Vt1$.

The effect on the resultant image signal due to the imbalance $dxi$ in voltage threshold of the transistors, therefore, is to introduce an imbalance of the amount $dxi$ on top of any image-induced off-balances.

Similarly, an imbalance in the transconductance of T1 and T2, bt1 and bt2, (or different capacitances C1 and C2) will result in the equations:

$$I1 = bt1*(V2-(V0+Vt))$$

$$I2 = bt2*(V1-(V0+Vt))$$

from which can be derived the equations $$d(sg)/dt = I0/2 = bt*(sg-(V0+Vt)) - dbt*xi/2$$

$$C*d(xi)/dt = (bt*xi) + dbt*(sg-(V0+Vt))$$

where
 bt = (bt1+bt2)/2
 dbt = bt2−bt1, and
 sg = (V2+V1)/2.

As before, if it is assumed that I0 is constant in time, the first equation will yield constant slope decay for sg, and neglecting the last term in the first equation, will produce the result:

$$sg - (V0+Vt) = I0/(2* bt)$$

which can be substituted into the second equation to yield:

$$C*d(xi)/dt = (bt*xi) + (dbt/bt)*I0/2,$$

or $$C*d(xi)/dt = bt*(xi+dxi)$$

where $dxi = (dbt*I0)/(2*bt^2)$. Thus, the effect of an imbalance in the transconductance is also to introduce an effective off-balance, this time in the amount:

$$(dbt*I0)/(2*bt^2)$$

Other circuit elements may also introduce imbalances in the race condition, including finite conductivity of the n-diffusion regions, transistor characteristics of T3 and T4 (or T5 and T6), etc.

One way to compensate for manufacturing imbalance is to mechanically induce compensating off-balances after the fabrication of the sensor and after testing the sensor against a null image. As seen in the above discussion, alteration of the relative voltage thresholds of T1 and T2, or alteration of the relative transconductances of T1 and T2 will produce changes in the initial imbalance. Methods for mechanical modification include ion bombardment of the channel areas of T1 and T2; laser trimming of the gate metallization of T1 or T2; and incomplete metallization that are later completed. Techniques for post processing integrated circuits in order to permanently modify the threshold voltages of FETs or to effect other balancing variations are well covered in the patented literature.

Another way to compensate for manufacturing imbalances is to electronicaly induce compensating off-balances. Transistor pairs, such as (T1, T2) or (T3, T4) (or any other pairs of elements in FIGS. 7 connected symmetrically with the circuit) constructed with electrically alterable means will allow a balancing operation to be carried out after a testing step wherein a null image is sensed. Electrically alterable means for FETs and MOS capacitors are well-known, such as floating gate or MNOS structures. By suitable arrangement within e.g. the circuit of FIG. 2a, an electrically alterable element is programmed by applying a high potential to a control lead to accellerate electrons into a floating gate or interface region and thereby alter the threshold voltage. The control lead may be an additional control lead not shown in FIG. 2a, or in a preferred embodiment, may be a lead normally used for another function, such as DEVn. Circuitry for driving the control lead, including circuitry necessary to drive the lead in two modes (a normal mode and a programming mode) are considered to be well documented in the patented literature and unnecessary for further elaboration in this specification.

In another method for electronically compensating for manufacturing imbalances, the image sensor includes memory means holding information relating to the amount of compensating off-balance necessary to compensate for manufacturing imbalances, and means to precharge capacitors C1 and C2 of each image sensing cell prior to each imaging cycle in accordance with the necessary amount of off-balance, rather than precharging with the same potential as previously discussed. If the image sensor comprises array of image sensing cells, the memory may be distributed throughout the image array, or may be located in a distinct array on the same or a different substrate. The imbalance memory is programmed with information pertaining to the amount of compensating balance needed to correct the manufacturing imbalances. The programming is obtained in response to the sensing of a null image, and may be effected permanently (e.g., by fuse means) or semipermanently (e.g., by electrically alterable means) in a manner well-known by those skilled in the memory art. The memory may be analog, in which case the signal provided by the memory may be applied directly to the precharge circuitry through suitable analog circuitry; or it may be digital, in which case the signal provided by the memory must first be converted to analog form by a D/A converter, as is well-known by those skilled in the art. The memory may be single-ended or complementary; and it may have redundant elements.

If off-balance precharging is not employed, it is possible to precharge the entire array (or some subset of the array) at one time by activating a plurality of word lines simultaneously while placing the precharge potential on the sense lines. However, if each image sensing cell must be individually precharged with an off-balance potential, it is no longer possible to simultaneously precharge the array by means of a distant imbalance memory; the array must be precharged a row at a time. For slow motion images or images restricted from reaching the array during the precharge period such a requirement will not cause a problem. But for fast moving images integrated during the precharge period the necessity of precharging the array a row at a time may cause noticeable image degradation. In a preferred embodiment, therefore, each image sensing cell includes means to isolate the image responsive means from the capacitive means during the precharge period during which the capacitive means is precharged a row at a time. After the precharge is completed, communication is permitted between the image responsive means and the capacitive means. The isolation means may also include means to hold the image responsive means at a known potential during the precharge period.

SUMMARY

A novel image sensor disclosed herein designed to sense the magnitude of a variety of images provides extreme sensitivity by employing continuous magnification within each image sensing cell to magnify the image response to a level whereby it can be sensed with high signal/noise ratio. Although numerous variations of the basic circuits have been presented for the purpose of exhibiting many of the unusual benefits and features of the instant invention, it should be appreciated that numerous additional modification will be obvious to those skilled in the art; and thus the scope of the invention is not to be limited by the specification appearing hereinbefore but rather to be defined by the true scope of the appended claims.

What I claim as new and desire to secure by Letters Patent of the United States is:

1. In the method of sensing the magnitude of at least one point of an image by means of at least one image sensing cell; said method including at least one cycle of the steps of:
    establishing a condition of electrical balance; and
    causing a condition of electrical off-balance by exposure to an image;
   the improvement comprising the additional step of:
    developing an image signal within said at least one image sensing cell by effecting a limited amount of continuous magnification responsive to said condition of electrical offbalance;
   whereby the magnitudes of said image and said image signal will be related by a definite degree of magnification.

2. The method of claim 1 of sensing the magnitude of at least one point of an image; wherein:
    said step of causing a condition of electrical off-balance comprises establishing a differential electric potential between two circuit nodes; and
    said step of developing an image signal comprises continuously magnifying said differential electric potential.

3. The method of claim 2 of sensing the magnitude of at least one point of an image; wherein:
said step of continuously magnifying said differential electric potential comprises causing a current to flow through at least one pair of first and second cross-coupled control elements driving said two circuit nodes.

4. The method of claim 1 of sensing the magnitude of at least one point of an image; wherein:
said step of causing a condition of electrical off-balance comprises establishing a differential conductivity between a first and second conductive element; and
said step of developing an image signal by continuous magnification comprises:
establishing a differential electric potential between two circuit nodes by passage of a current through said first and second conductive elements; and
continuously magnifying said differential electric potential.

5. The method of claim 4 of sensing the magnitude of at least one point of an image wherein:
said step of continuously magnifying said differential electric potential comprises causing a current to flow through at least one pair of first and second cross-coupled current control elements driving said two circuit nodes.

6. The method of claim 1 of sensing the magnitude of at least one point of an image wherein said definite degree of magnification is controlled by varying said limited amount of continuous magnification in dependence upon the image signal resulting from a previous cycle of sensing of an image; whereby the new image signal can be caused to be at an optimal point in the dynamic range of said image sensor.

7. The method of claim 1 of sensing the magnitude of at least one point of an image wherein said step of continuous magnification includes a first substep of continuous magnification during which a first definite magnification occurs, and a second substep of continuous magnification during which a second definite magnification occurs.

8. The method of claim 7 of sensing the magnitude of at least one point of an image, including a testing substep following said first continuous magnification and prior to said second continuous magnification; said testing substep including sensing the image signal of said at least one image sensing cell only if a condition is satisfied; whereby the image signal of said image sensing cell will receive a first degree of definite magnification resulting from said first continuous magnification if said condition is satisfied, and a larger degree of definite magnification resulting from the combined magnifications of said first and second continuous magnifications if said condition is unsatisfied.

9. The method of claim 8 of sensing the magnitude of at least one point of an image wherein said condition is defined by whether or not said image signal has reached a threshold.

10. The method of claim 1 of sensing the magnitude of at least one point of an image wherein said image comprises at least one of: an electromagnetic image, an electric image, a magnetic image, a beamed particle image, a vibrational image, a thermal image, a force image, and a chemical image.

11. The method of sensing the magnitude of at least one point of an image by means of at least one image sensing cell; said method including at least one cycle of the steps of:
establishing a condition of electrical balance; said condition of electrical balance including a compensating electrical off-balance to compensate for manufacturing imbalances in the electrical components;
causing an image-responsive condition of electrical off-balance by exposure to an image; and
developing an image signal within said at least one image sensing cell by a limited amount of continuous magnification of said conditions of compensating and image-responsive electrical off-balance.

12. The method of claim 1 of sensing at least one point of an image, wherein said at least one image sensing cell has at least one electrically alterable element having semi-permanent electrical characteristics; and including at least one cycle of the steps of:
deriving imbalance information by sensing a null image; and
modifying by means of said imbalance information the electrical characteristics of said electrically alterable element;
thereby to reduce the degree of imbalance resulting from manufacturing variations.

13. The method of claim 11 of sensing at least one point of an image, wherein said compensating electrical off-balance is derived from an imbalance-memory; and wherein said method includes at least one cycle of the steps of:
deriving imbalance information by sensing a null image; and
modifying by means of said imbalance information the contents of said imbalance-memory;
thereby to reduce the degree of imbalance resulting from manufacturing variations.

14. The method of claim 13 of sensing the magnitude of at least one point of an image wherein said step of establishing a condition of electrical balance for all of said image sensing cells undergoing said at least one cycle is separated in time from said step of causing an image-responsive condition of electrical off-balance.

15. The method of claim 14 of sensing the magnitude of at least one point of an image, wherein said at least one image sensing cell has a first sub-circuit comprising image responsive elements and a second sub-circuit wherein said condition of electrical balance is established and containing no image responsive elements; and wherein said separation in time is effected by maintaining said first sub-circuit in electrical isolation from said second sub-circuit during said step of establishing said condition of electrical balance.

16. The method of claim 14 of sensing the magnitude of at least one point of an image, wherein said separation in time is effected by restricting said image from reaching said at least one image sensing cell during said step of establishing said condition of electrical balance.

17. The method of claim 11 of sensing the magnitude of at least one point of an image wherein said image comprises at least one of: an electromagnetic image, an electric image, a magnetic image, a beamed particle image, a vibrational image, a thermal image, a force image, and a chemical image.

18. An image sensor for sensing the magnitude of at least one point of an image, said image sensor having at least one image sensing cell having:
means to establish a condition of electrical balance;

means to cause a condition of electrical off-balance in response to an image;

means to cause a limited amount of continuous magnification responsive to said condition of electrical off-balance.

19. The image sensor of claim 18 for sensing the magnitude of at least one point of an image, wherein said at least one image sensing cell contains at least one circular path that has at least two states: a first quiescent state wherein the open loop transfer function is substantially zero and a second continuous magnification state wherein the open loop transfer function equals unity for values of the Laplace variable lying in the positive half plane.

20. The image sensor of claim 19 for sensing the magnitude of at least one point of an image, wherein said at least one circular path resides in at least one cross-coupled electrical sub-network represented by the general topological formula:

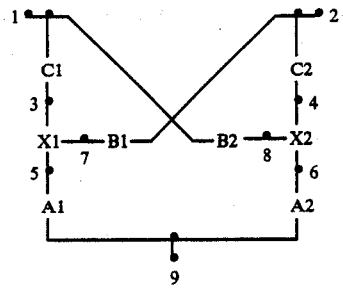

wherein:

X1, X2 represents a pair of current control elements having substantially balanced electrical characteristics in the absence of an image, and having control terminals at node points 7 and 8;

A1, A2; B1, B2; C1, C2 represent pairs of electrical elements, each pair having substantially balanced electrical characteristics in the absence of an image, and chosen from the set consisting of: direct connection, conductive element, capacitive element, conductive-capacitive element;

wherein at least one element in said sensing cell has electrical properties responsive to an image; and wherein said means to cause a limited amount of continuous magnification during said continuous magnification state comprises mans for limiting the profile of electric charge flowing through node point 9.

21. The image sensor of claim 19 for sensing the magnitude of at least one point of an image, wherein said at least one circular path resides in at least one cross-coupled electrical sub-network having the elements:

X1, X2 representing a pair of current control elements having substantially balanced electrical characteristics in the absence of an image; each having two current nodes and a control terminal;

A1, A2; B1, B2; C1, C2 representing pairs of electrical elements, each element having two nodes, each pair of elements having substantially balanced electrical characteristics in the absence of an image, and chosen from the set consisting of: direct connection, conductive element, capacitive element, conductive-capacitive element;

wherein the current nodes of X1 are connected to C1 and A1 through node points which may be labelled 3 and 5, respectively; the current nodes of X2 are connected to C2 and A2 through node points which may be labelled 4 and 6, respectively; the other nodes of C1 and C2 may be labelled node points 1 and 2; the control terminals of X1 and X2, which may be labelled by node points 7 and 8, respectively, are connected to node points 2 and 1, respectively; and the other nodes of A1 and A2 connected in common to a node point which may be labelled node point 9; and wherein at last one element in said image sensing cell has electrical properties responsive to an image; and wherein said means to cause a limited amount of continuous magnification during said continuous magnification state comprises means for limiting the profile of electric charge flowing through node point 9.

22. The image sensor of claim 20 for sensing the magnitude of at least one point of an image, wherein said means for limiting the profile of electric charge flowing through node point 9 comprises a third current control element connected between node point 9 and a source of electrical bias, and means for actuating said third current control element with an electric signal of limited profile.

23. The image sensor of claim 20 for sensing the magnitude of at least one point of an image, wherein said at least one image sensing cell contains:

A first cross-coupled electrical sub-network as claimed, having current control elements X1 and X2 and electrical elements A1, A2, B1, B2, C1, C2, and node points 1-9;

A second cross-coupled electrical sub-network as claimed, of opposite conductivity type to said first electrical sub-network, and having current control elements X3, X4 and electrical elements A3, A4, B3, B4, C3, C4, and node points 11-19;

Wherein said node points 1 and 2 are in electrical communication with said node points 11 and 12, respectively,; and at least X3 and X4 are distinct electrical elements from X1 and X2.

24. The image sensor of claim 23 for sensing the magnitude of at least one point of an image, wherein said means for limiting the profile of electric charge flowing through node points 9 and 19 comprises a fifth and a sixth current control element that may be labelled X5 and X6 and connected to said node points 9 and 19 respectively and to two sources of electrical bias, wherein said current control element X5 is of the same conductivity type as X1 and X2 and said current control elements X6 is of the same conductivity type as X3 and X4; and means for actuating X5 and X6 with electric signals of limited profile.

25. The image sensor of claim 24 for sensing the magnitude of at least one point of an image, wherein said means for actuating X5 and X6 comprises means for causing substantially the same charge profile to pass through X5 and X6.

26. The image sensor of claim 20 for sensing the magnitude of at least one point of an image, wherein said at least one image sensing cell has at least one electrically alterable element having semi-permanent electrical characteristics; and including means for modifying said electrical characteristics of said at least one electrically alterable element responsive to imbalance information derived from sensing a null image.

27. The image sensor of claim 20 for sensing the magnitude of at least one point of an image, wherein said means to establish a condition of electrical balance comprises means for placing node points 1 and 2 of said at least one cross-coupled electrical sub-network in communication with sources of electrical potential.

28. The image sensor of claim 27 for sensing the magnitude of at least one point of an image, wherein said sources of electrical potential are in accordance with a compensating off-balance potential, in order to compensate imbalances resulting from manufacturing variations.

29. The image sensor of claim 28 for sensing the magnitude of at least one point of an image, wherein said compensating off-balance potential is derived from information contained in an imbalance-memory having at least one storage cell for each image sensing cell, and further wherein means is provided to program said imbalance-memory in response to the imbalance image signal obtained from sensing a null image.

30. The image sensor of claim 29 wherein said imbalance-memory comprises at least one of: a digital memory, an analog memory having single-ended storage; an analog memory having differential storage; an electrically alterable memory.

31. The image sensor of claim 27 including means to maintain all image responsive elements of said at least one image sensing cell in electrical isolation from said node points 1 and 2 during at least one finite period of time.

32. The image sensor of claim 18 wherein said means to cause a condition of electrical off-balance in response to an image is responsive to a least one of: an electromagnetic image, an electric image, a magnetic image, a beamed particle image, a vibrational image, a thermal image, a force image, and a chemical image.

33. The image sensor of claim 19 for sensing the magnitude of at least one point of an image, wherein said at least one circular path resides in at least one cross-coupled electrical sub-network represented by the general topological formula:

(9-10)-Attached-(X1 - 7 - B1 - 2), (X2 - 8 - B2 - 1)-Cross-Coupled-

--(1 - C1 - 3 - X1 - 5 - A1 - 10 - A2 - 6 - X2 - 4 - C2 - 2)

wherein:
  X1, X2 represents a pair of current control elements having substantially balanced electrical characteristics in the absence of an image, and having control terminals at node points 7 and 8;
  A1, A2, B1, B2, C1, C2 represent pairs of electrical elements, each pair having substantially balanced electrical characteristics in the absence of an image, and chosen from the set consisting of: direct connection, conductive element, capacitive element, conductive-capacitive element;
wherein at least one element in said image sensing cell has electrical properties responsive to an image; and wherein said means to cause a limited amount of continuous magnification during said continuous magnification state comprises means for limiting the profile of electric charge flowing through node point 9.

* * * * *